United States Patent
Kasai et al.

(10) Patent No.: US 7,842,891 B2
(45) Date of Patent: Nov. 30, 2010

(54) SEALING BOARD AND METHOD FOR PRODUCING THE SAME

(75) Inventors: Takao Kasai, Nagano (JP); Haruyuki Hiratsuka, Nagano (JP)

(73) Assignee: Citizen Holdings Co. Ltd., Tokyo (JP)

( * ) Notice: Subject to any disclaimer, the term of this patent is extended or adjusted under 35 U.S.C. 154(b) by 334 days.

(21) Appl. No.: 11/795,715

(22) PCT Filed: Jan. 20, 2006

(86) PCT No.: PCT/JP2006/300863

§ 371 (c)(1),
(2), (4) Date: May 28, 2008

(87) PCT Pub. No.: WO2006/077974

PCT Pub. Date: Jul. 27, 2006

(65) Prior Publication Data

US 2009/0120684 A1    May 14, 2009

(30) Foreign Application Priority Data

Jan. 21, 2005    (JP) ............................. 2005-013676

(51) Int. Cl.
*H01L 23/02* (2006.01)
*H05K 5/06* (2006.01)

(52) U.S. Cl. .................................... 174/564; 228/179.1
(58) Field of Classification Search ............... 174/520, 174/559, 560, 564; 228/179.1
See application file for complete search history.

(56) References Cited

U.S. PATENT DOCUMENTS

| 5,494,781 A | 2/1996 | Ohtani et al. |
| 2004/0188124 A1* | 9/2004 | Stark .................... 174/52.3 |

FOREIGN PATENT DOCUMENTS

| CN | 1103233 A | 5/1995 |
| JP | 05-167377 | 7/1993 |
| JP | 2001-345394 | 12/2001 |
| JP | 2002-009186 | 1/2002 |

(Continued)

OTHER PUBLICATIONS

Machine translation for JP 2004-186428 A translated on Feb. 9, 2010 (18 pages).*

(Continued)

*Primary Examiner*—Hung V Ngo
(74) *Attorney, Agent, or Firm*—Smith, GAmbrell & Russell, LLP

(57) ABSTRACT

There is provided a sealing board (30) for sealing a container containing an electronic component, constituted of a base which is made of a material exhibiting a low wettability to a brazing filler metal (31) and on a surface of which a metal layer exhibiting a high wettability to the brazing filler metal (31) is formed, a brazing filler metal portion formed on the metal layer to form a closed region, and an exposed portion in which a surface of the base is exposed in at least a part of the closed region. By making at least a part of the sealing board as the exposed portion, it is possible to produce the sealing board with the brazing filler metal for a package stable in quality and inexpensively.

6 Claims, 7 Drawing Sheets

FOREIGN PATENT DOCUMENTS

| | | |
|---|---|---|
| JP | 2003-163298 | 6/2003 |
| JP | 2003-163299 | 6/2003 |
| JP | 2004-186428 | 7/2004 |

OTHER PUBLICATIONS

PCT First Notice Informing the Applicant of the Communication of the International Application (Form PCT/IB/308) dated Jan. 2004.

PCT Second and Supplementary Notice Informing the Applicant of the Communication of the International Application (Form PCT/IB/308) dated Jan. 2004.

Notification of the First Examination Report issued on Chinese Appln. No. 200680002722.4, "Sealing Board and Method for Producing the Same", dated May 30, 2008, with English translation.

* cited by examiner

[Fig. 1]
(a)
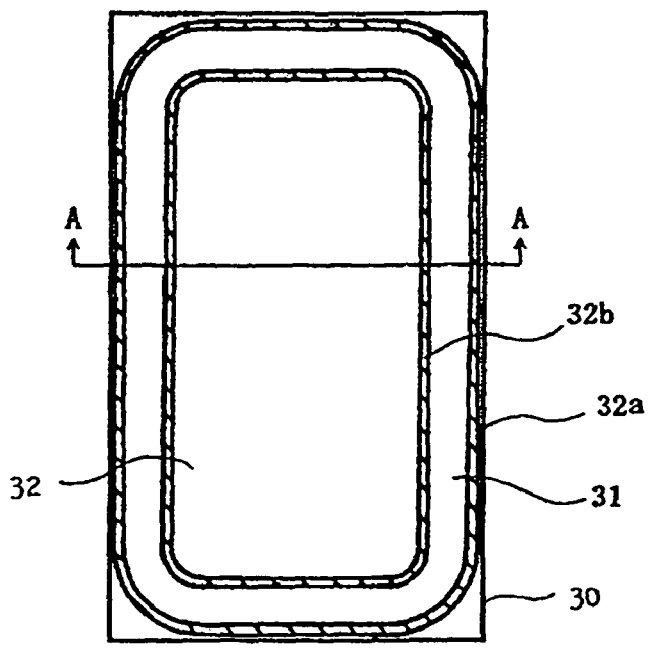
(b)
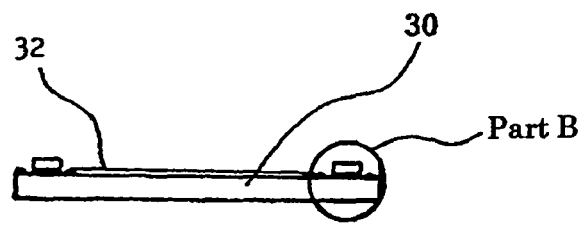
(c)
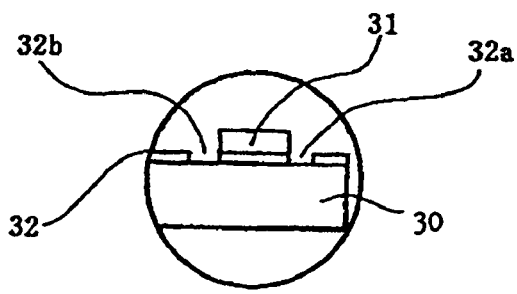
Enlarged view of part B

[Fig. 2]
(a) 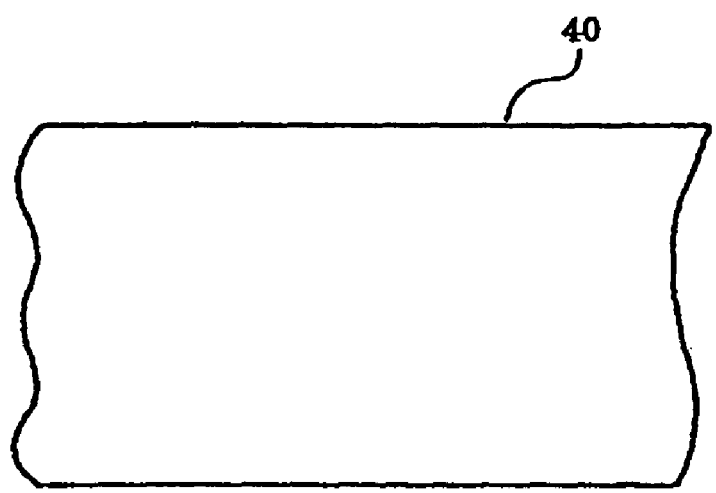
(b) 

[Fig. 3]
(a)
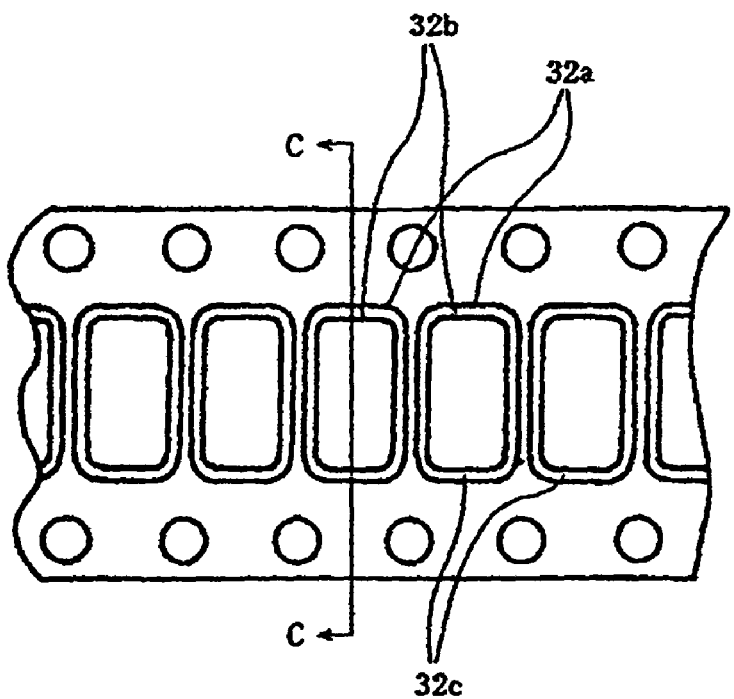
(b)
Part D
(c)
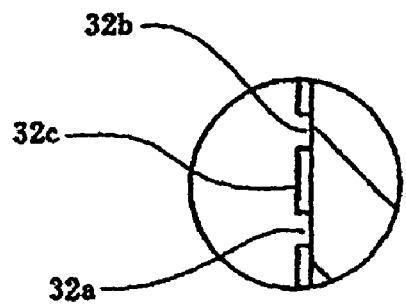
Enlarged view of part D

[Fig. 4]
(a)
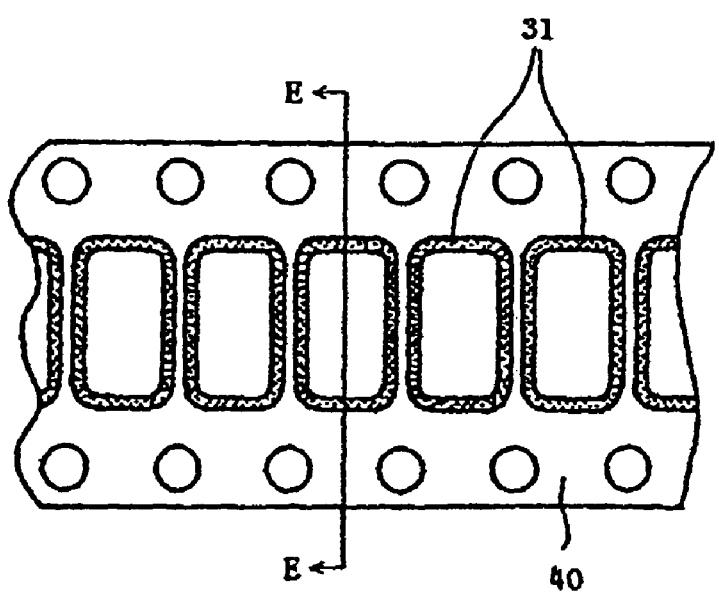
(b)
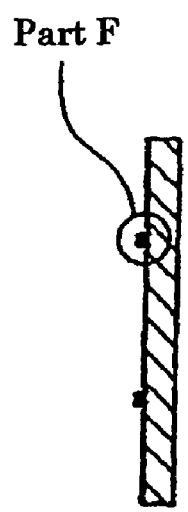
Part F
(c)
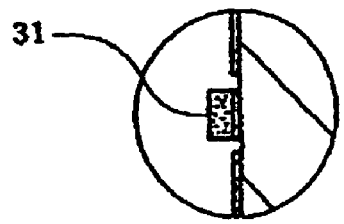
Enlarged view of part F

[Fig. 5]
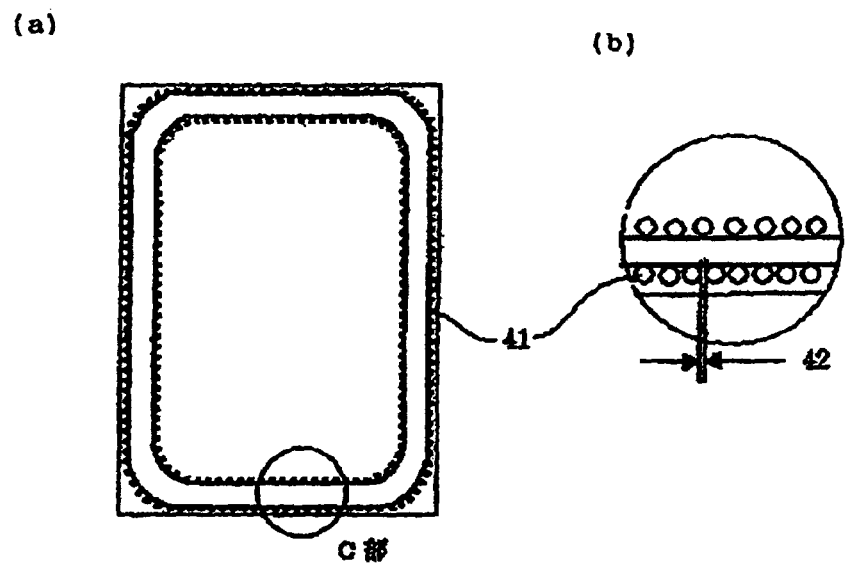
[Fig. 6]
—Prior Art—
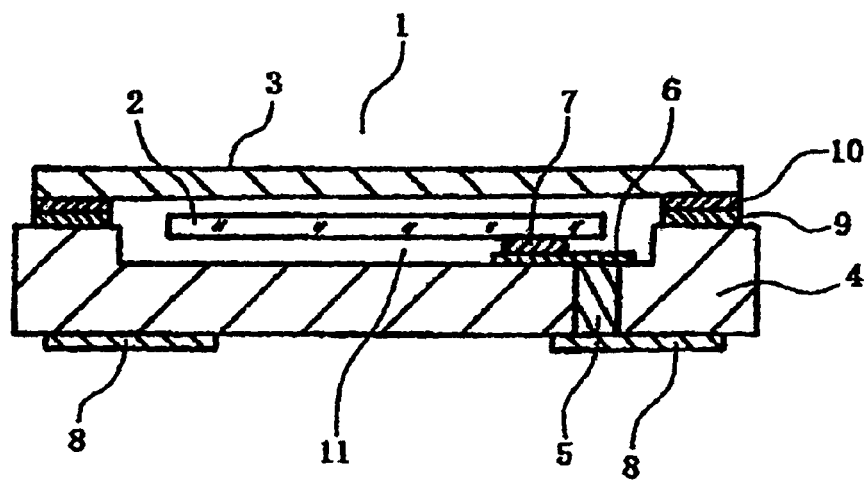

[Fig. 7]
(a)
—Prior Art—
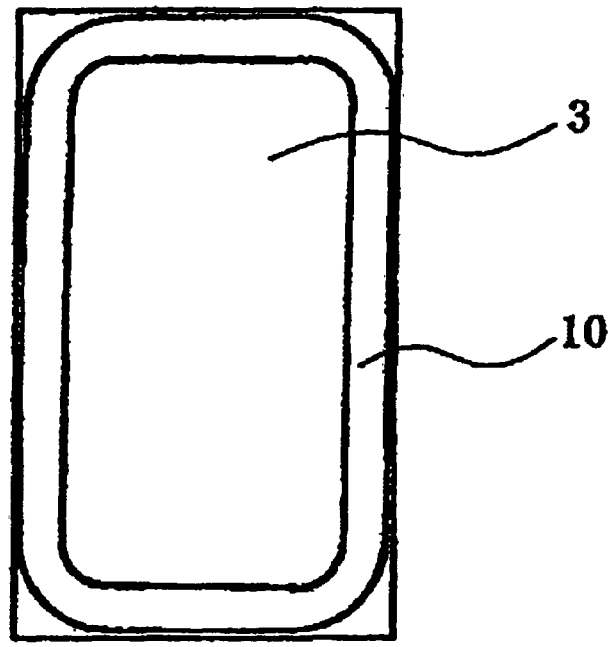
(b)
—Prior Art—
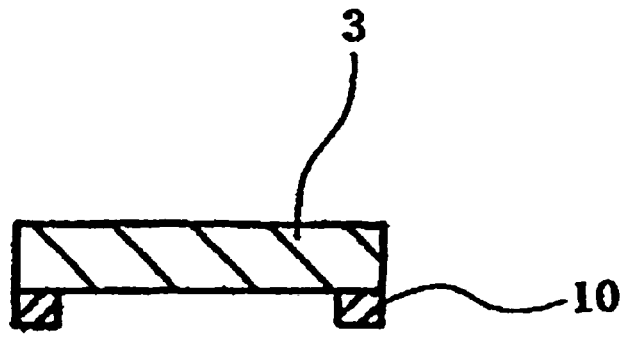

[Fig. 8]
—Prior Art—
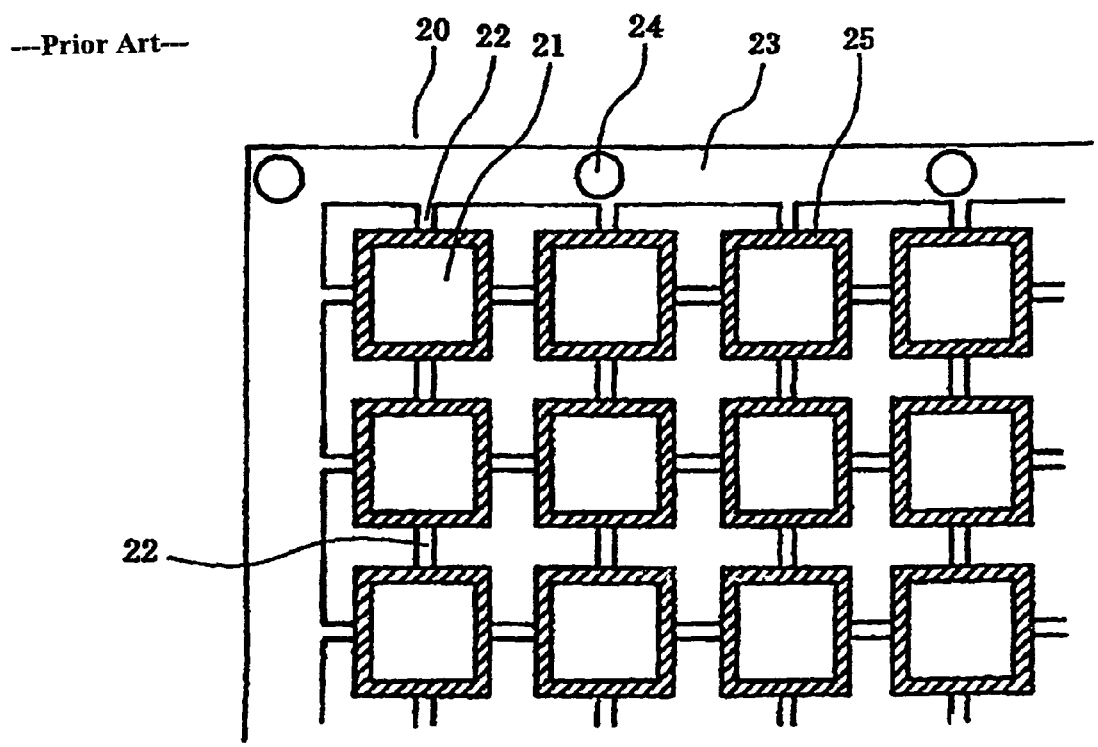

SEALING BOARD AND METHOD FOR PRODUCING THE SAME

TECHNICAL FIELD

The present invention relates to a sealing board for sealing a container containing an electronic component and a method of producing the sealing board.

BACKGROUND ART

The number of surface mount electronic components using ceramic for various electronic element packages increases. Most of them are structured so that an electronic element is contained in a ceramic package in which a concave portion is formed and so that an opening portion of the ceramic package is airtight sealed by a metal flat cap (hereinafter "sealing board").

FIG. 6 is a cross-sectional view of a crystal oscillator sealed by a ceramic package. Reference numeral 1 denotes a surface mount crystal oscillator, and reference numeral 4 denotes a ceramic substrate constituting a package of the surface mount crystal oscillator 1. Reference numeral 3 denotes a flat sealing board, which covers up the ceramic substrate 4 constituting the package of the surface mount crystal oscillator 1 and which is normally made of Kovar (alloy of iron, nickel, and cobalt). Reference numeral 2 denotes a crystal piece, which is contained in an inner space 11 restricted by the ceramic substrate 4 and the sealing board 3.

A wiring layer 6 is formed on an upper surface of the ceramic substrate 4 so as to prevent the wiring layer 6 from becoming conductive to the sealing board 3, and is made electrically conductive to a wiring layer that is a terminal electrode 8 formed on a lower surface of the ceramic substrate 4 by an internal wiring 5. One end of the crystal piece 2 is bonded onto the wiring layer 6 via a conductor paste 7. Furthermore, a metallization layer 9 bonding the sealing board 3 is formed on the upper surface of the ceramic substrate 4. The ceramic substrate 4 is bonded to the sealing board 3 by forming a brazing filler metal 10 serving as a bonding layer on the metallization layer 9 or a sealing surface side of the sealing board 3 and fusion bonding the ceramic substrate 4 to the sealing board 3.

FIGS. 7(a) and 7(b) are a front view and a cross-sectional view showing the sealing board, on which the brazing filler metal is formed, as viewed from a brazing filler metal side, respectively. The brazing filler metal 10 serving as the bonding layer is fusion bonded to a fusion-bonding portion of the sealing board 3 which is a bonded portion to the ceramic package, thereby forming a sealing board with the brazing filler metal for the package. As a material of the brazing filler metal 10, a gold-tin alloy, a lead-tin solder, a tin-copper alloy, a tin-silver alloy or the like is used according to a purpose of the brazing filler metal 10.

As a method of producing a sealing board, there is disclosed a method including pressing a thin brazing filler metal foil into a ring shape (a shape corresponding to the fusion-bonding portion), combining the ring-shaped thin brazing filler metal foil with a sealing board that has been subjected to a surface treatment (which is generally Ni/Au plating; however, which can be Ag plating or Sn plating) for ensuring adhesiveness to a brazing filler metal, conducting a heat treatment at a temperature equal to or higher than a melting point of the brazing filler metal, and fusion bonding the ring-shaped brazing filler metal onto one surface of the sealing board (see, for example, Background Art Section of Japanese Patent Application Laid-Open No. 2002-9186).

There is also disclosed a method of forming a brazing filler metal by plating or printing (see, for example, Japanese Patent Application Laid-Open Nos. 2003-163298 and 2003-163299) The sealing board is molded into a form in which many sealing boards are arrayed and connected via sealing board connectors, and dealt with in a state in which the sealing boards are positioned and fixed, similarly to the method disclosed in the Japanese Patent Application Laid-Open No. 2002-9186.

FIG. 8 is a top view of a metal board formed by arraying many sealing boards on a metal substrate in a matrix. Positioning holes 24 and many sealing boards 21 are formed on the metal substrate 20 by either pressing or etching. The respective sealing boards 21 are connected to an outer peripheral frame 23 by connection bars 22. A brazing filler metal 25 is fusion bonded to each sealing board 21 by directly forming the brazing filler metal 25 on a brazing filler metal fusion-bonding portion by plating or printing, or by punching out a brazing filler metal foil and setting the punched foil onto each sealing board 21. Thereafter, a group of the sealing boards is separated into individual sealing boards each with the brazing filler metal. In case of forming the brazing filler metal after producing the sealing board, the brazing filler metal is fusion bonded to the sealing board by setting the brazing filler metal and the sealing board on a tool.

The sealing board as stated above has the following problems. It is difficult to manage a thickness and a width of the sealing board required for sealing in a state in which the brazing filler metal is fusion bonded to the sealing board. To ensure high adhesiveness between the sealing board and the brazing filler metal, it is necessary to heat the brazing filler metal for long time or at high temperature when the brazing filler metal is fusion bonded to the sealing board. As a result, the brazing filler metal is wetted and spread up to unnecessary portions. Due to this, the brazing filler metal has irregular thicknesses and a portion in which the brazing filler metal is thin is formed, resulting in a sealing defect.

Moreover, if airtightness of an interior of a package is an important factor for characteristics for a case of a crystal oscillator, discharge of air bubbles present in the brazing filler metal into the package during bonding of the ceramic package to the sealing board causes deterioration in characteristics. To sufficiently defoaming the air bubbles present in the brazing filler metal, it is necessary to heat the brazing filler metal for long time or at high temperature when the brazing filler metal is fusion bonded to the sealing board. In this case, the problem of wetting and spreading the brazing filler metal similarly occurs. Particularly if the brazing filler metal is fusion bonded to the sealing board either by a brazing filler metal paste used for printing or by plating, it is necessary to heat the brazing filler metal for long time. To avoid the problems, it is necessary to use an expensive brazing filler metal more than necessary.

Furthermore, there is disclosed a method including plating only a brazing filler metal surface of a sealing board with gold and applying a brazing filler metal onto the gold-plated surface (see, for example, Japanese Patent Application Laid-Open No. 2004-186428). However, this method is accompanied with complicated steps and unavoidably confronted with cost increase. Further, a method including forming a roughened surface by pressing, honing, and etching, and providing the roughened surface as a brazing filler metal flow-preventing band is proposed. However, development of many technical elements is necessary to carry out the method and the method is, therefore, impractical.

DISCLOSURE OF THE INVENTION

The present invention has been made to solve the above-stated problems. It is an object of the present invention to provide a sealing board stable in quality and low in cost and a method of producing the sealing board.

Therefore, a sealing board according to the present invention is constituted by including the following constituent elements:

(1) a base made of a material exhibiting a low wettability to a brazing filler metal, on a surface of which a metal layer exhibiting a high wettability to the brazing filler metal is formed;

(2) a brazing filler metal portion formed on the metal layer to form a closed region; and (3) an exposed portion in which a surface of the base is exposed in at least a part of the closed region.

According to a first aspect of the present invention, a method of producing a sealing board comprises the following steps:

(1) forming a metal layer exhibiting a high wettability to a brazing filler metal on a surface of a base made of a material exhibiting a low wettability to the brazing filler metal;

(2) bonding the brazing filler metal onto the metal layer so as to form a closed region; and (3) exposing the surface of the base by removing at least a part of the metal layer in the closed region.

According to a second aspect of the present invention, a method of producing a sealing board comprises the following steps:

(1) forming a metal layer exhibiting a high wettability to a brazing filler metal on a surface of a flat base made of a material exhibiting a low wettability to the brazing filler metal, the flat base forming a plurality of sealing boards;

(2) bonding the brazing filler metal onto the metal layer of the sealing boards so as to form a closed region;

(3) exposing a surface of the base by removing at least a part of the metal layer in the closed region; and (4) separating the sealing boards on which the brazing filler metal is formed from the base.

Furthermore, in the step (3), the surface of the base can be exposed by irradiating a beam to remove at least the part of the metal layer in the closed region.

Moreover, the beam may be a laser beam or an electronic beam.

BRIEF DESCRIPTION OF THE DRAWINGS

FIG. 1(a) is a top view showing a sealing board according to an embodiment of the present invention. FIG. 1(b) is a cross-sectional view taken along A-A of FIG. 1(a). FIG. 1(c) is an enlarged view of part B shown in FIG. 1(b).

FIG. 2(a) is a partial top view of a band member made of a Kovar material that is a material of a sealing board used in the present invention. FIG. 2(b) is a side view of FIG. 2(a).

FIG. 3(a) is a top view showing that holes and many sealing boards are formed on the band material for positioning transport positions, and that brazing filler metal flow-preventing portions are formed at each of the sealing boards. FIG. 3(b) is a cross-sectional view taken along C-C of FIG. 3(a). FIG. 3(c) is an enlarged view of a part D shown in FIG. 3(b).

FIG. 4(a) is a top view showing that a brazing filler metal is applied onto the brazing filler fusion-bonding portion surrounded by the brazing filler metal flow-preventing portions by a printing method. FIG. 4(b) is a cross-sectional view taken along E-E of FIG. 4(a). FIG. 4(c) is an enlarged view of a part F shown in FIG. 4(b).

FIG. 5(a) is a top view showing a sealing board according to another embodiment of the present invention. FIG. 5(b) is an enlarged view of a part C shown in FIG. 5(a).

FIG. 6 is a cross-sectional view of a crystal oscillator sealed by a ceramic package.

FIG. 7(a) is a front view showing a sealing board, on which the brazing filler metal is formed, from a brazing filler metal side. FIG. 7(b) is a cross-sectional view of FIG. 7(a).

FIG. 8 is a top view of a metal substrate formed by arraying and connecting many sealing boards in a matrix on the metal substrate.

BEST MODE FOR CARRYING OUT THE INVENTION

Preferred embodiments of the present invention will be described with reference to the accompanying drawings to describe the present invention in more detail.

First Embodiment

A sealing board according to a first embodiment of the present invention will be described with reference to FIGS. 1(a) to 1(c).

Reference numeral 30 denotes a sealing board made of Kovar, and a Ni/Au metal layer 32 is formed on a surface of the sealing board 30. A brazing filler metal 31 is fusion bonded onto the metal layer 32. As shown in FIG. 1(c), the metal layer 32 is not formed around portions onto which the brazing filler metal 31 is fusion bonded but brazing filler metal flow-preventing portions 32a and 32b in which the surface of the sealing board 30 is exposed are formed.

Next, a method of producing the sealing board 30 shown in FIGS. 1(a) to 1(c) will be described with reference to schematic diagrams of FIGS. 2 to 4.

FIGS. 2(a) and 2(b) show a band member made of Kovar that is a material of the sealing board 30. A band member 40 is prepared first, and a surface of the band member 40 is plated with Ni by 0.5 micrometer (μm) to 1.0 μm and Au by 0.5 μm to 1.0 μm. A thickness of the band member 40 prepared is the same as that of the sealing board 30.

FIGS. 3(a) to 3(c) show a state in which brazing filler metal flow-preventing portions are formed on the band member 40. FIG. 3(a) shows a process of producing a plurality of sealing board 30 out of the band member 40. In this producing process, the respective sealing boards 30 are connected to the band member 40 by connection bars similarly to FIG. 8 with respect to which the background art is described above. Since this connection method is similar to the conventional technique, it will not be shown and described.

The brazing filler metal flow-preventing portions 32a and 32b are formed by irradiating a laser beam onto positions corresponding to surroundings of a brazing filler metal fusion-bonding portion 32c onto which the brazing filler metal 31 is fusion bonded to remove Ni-plated and Au-plated metal layers formed on the surface of the band member 40. Meanwhile, as a material used for the sealing board 30 (band member 40), Kovar, 42 alloy or the like closer to ceramic in coefficient of thermal expansion is selected if a package substrate is a ceramic substrate. If the package substrate is a metal substrate, an appropriate material can be selected in view of a coefficient of thermal expansion of the package substrate.

Generally, however, a material used for the sealing board 30 is low in wettability to the brazing filler metal. Due to this, by forming portions in which the surface of the sealing board 30 is exposed such as the brazing filler metal flow-preventing portions 32a and 32b on a part of the sealing board 30, it is possible to prevent the brazing filler metal from being wetted and spread to the portions and to eventually make the thickness of the brazing filler metal 31 constant. It is thereby possible to facilitate managing temperature and time for fusion bonding of the brazing filler metal, and to provide a brazing filler metal-added sealing board in which the thickness of the brazing filler metal fusion bonded to the sealing board is constant and air bubbles are sufficiently defoamed.

In the above-stated producing process, the metal layers are removed by irradiating a laser beam. Alternatively, the metal layers may be removed by irradiating the other beam such as an electron beam. In this manner, the metal layers are partially removed by irradiating a beam such as a laser beam. Therefore, there is no need to execute steps of removing a part of the metal layers by etching or honing, and forming and peeling off a mask necessary to form a roughened surface, whereby the brazing filler metal-added sealing board can be provided at lower cost. Besides, beam-based working can advantageously ensure high accuracy.

A step of applying the brazing filler metal onto the brazing filler metal fusion-bonding portion surrounded by the brazing filler metal flow-preventing portions by printing will be described with reference to FIGS. 4(a) to 4(c).

As the brazing filler metal 31, gold-tin alloy powder, for example, is mixed with flux, solvent, thixotropic agent or the like to form a printing paste, and the printing paste is applied to the brazing filler metal fusion-bonding portion 32c by screen printing. An amount of the brazing filler metal 31 is adjusted based on a content of the powder in the paste and a thickness of a screen. The brazing filler metal 31 may be formed by punching out a foil. After application of the brazing filler metal 31, a heat treatment is carried out, thereby fusion bonding the brazing filler metal 31 to the sealing board 30 and defoaming air bubbles present in the brazing filler metal 31. Further, a group of a plurality of sealing boards 30 formed on the band member 40 is separated into individual sealing boards 30. Since the surface of each of the sealing boards 30 separated from the band member 40 may possibly be exposed and corroded, each sealing board 30 is plated with Au, thus completing a brazing filler metal-added sealing board.

Second Embodiment

A sealing board according to a second embodiment of the present invention will be described with reference to FIGS. 5(a) and 5(b).

The brazing filler metal 31 has high surface tension in a molten state. Due to this, it is not always necessary to surround the brazing filler metal fusion-bonding portion with the brazing filler metal flow-preventing portions provided on the sealing board seamlessly. For example, as shown in FIG. 5(b), even if brazing filler metal flow-preventing portions 41 are formed at intervals, it is possible to prevent unnecessary wetting and spread of the brazing filler metal. An interval 42 between two adjacent brazing filler metal flow-preventing portions 41 depends on a type of the brazing filler metal and temperature conditions for melting the brazing filler metal. However, it has been understood that the interval 42 is allowed up to 0.1 millimeter if the brazing filler metal is, for example, Au—Sn.

The preferred embodiments of the present invention have been described so far. However, the present invention is not at all limited by the above-stated embodiments but various changes can be made in the present invention within an applicable range of the invention.

The invention claimed is:

1. A method of producing a sealing board for sealing a container containing an electronic component, comprising the steps of:
   (1) forming a metal layer, exhibiting a high wettability to a brazing filler metal, on an entire surface of a base made of a material exhibiting a low wettability to the brazing filler metal;
   (2) bonding the brazing filler metal onto the metal layer so as to form a closed region, and a brazing filler metal fusion-bonded region where the brazing filler metal is fusion-bonded to the metal layer; and
   (3) exposing the surface of the base by removing at least a part of the metal layer in the closed region on opposite sides of the brazing filler metal fusion-bonded region so as to surround the brazing filler metal fusion-bonded region.

2. A method of producing a sealing board for sealing a container containing an electronic component, comprising the steps of:
   (1) forming a metal layer, exhibiting a high wettability to a brazing filler metal, on an entire surface of a flat base made of a material exhibiting a low wettability to the brazing filler metal, the flat base forming a plurality of sealing boards;
   (2) bonding the brazing filler metal onto the metal layer of the sealing boards so as to form a closed region;
   (3) exposing a surface of the base by removing at least a part of the metal layer in the closed region surrounding a brazing filler metal fusion-bonding portion upon which the brazing filler metal is fusion-bonded; and
   (4) separating the sealing boards on which the brazing filler metal is formed from the base.

3. The method of producing a sealing board according to claim 1 or 2, wherein in the step (3), the surface of the base can be exposed by irradiating a beam to remove at least the part of the metal layer in the closed region.

4. The method of producing a sealing board according to claim 3, wherein the beam is a laser beam or an electronic beam.

5. A sealing board for sealing a container containing an electronic component, comprising:
   a base;
   a metal layer provided on a surface of the base to form a closed region where the metal layer covers the base, and an exposed region where the metal layer does not cover the entire base; and
   a brazing filler metal portion formed of brazing filler metal on the metal layer in the exposed portion by fusion bonding to define a brazing filler metal flow-preventing portion on either side of the brazing filler metal portion between the sides of the brazing filler metal portion and sides of the closed region, wherein
   the base is made of a material exhibiting relatively low wettability to the brazing filler metal,
   the metal layer exhibits relatively high wettability to the brazing filler metal, and
   the base material is exposed in the brazing filler metal flow-preventing portions.

6. The sealing board according to claim 5, wherein
   a first of the brazing filler metal flow-preventing portions is surrounded by a second of the brazing filler metal flow-preventing portions, and
   the first brazing metal flow-preventing portion surrounds an interior section of the closed region, the interior section of the closed region being formed entirely of the metal layer and the base.

* * * * *